United States Patent
Dimitrakopoulos et al.

(10) Patent No.: US 9,337,274 B2
(45) Date of Patent: May 10, 2016

(54) FORMATION OF LARGE SCALE SINGLE CRYSTALLINE GRAPHENE

(71) Applicant: GLOBALFOUNDRIES INC., Grand Cayman (KY)

(72) Inventors: Christos D. Dimitrakopoulos, Baldwin Place, NY (US); Keith E. Fogel, Hopewell Junction, NY (US); Jeehwan Kim, White Plains, NY (US); Hongsik Park, Yorktown Heights, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 379 days.

(21) Appl. No.: 13/894,954

(22) Filed: May 15, 2013

(65) Prior Publication Data

US 2014/0342127 A1 Nov. 20, 2014

(51) Int. Cl.
*H01L 29/06* (2006.01)
*H01L 21/027* (2006.01)
(Continued)

(52) U.S. Cl.
CPC ............ *H01L 29/1606* (2013.01); *B32B 9/007* (2013.01); *B32B 9/04* (2013.01); *B32B 9/041* (2013.01); *B32B 37/26* (2013.01); *B32B 38/10* (2013.01); *C01B 31/00* (2013.01);
(Continued)

(58) Field of Classification Search
CPC ..................... Y10T 428/24612; Y10T 428/26; Y10T 156/11; Y10T 156/1153; Y10T 156/115; B32B 2307/202; B32B 2307/704; B32B 37/26; B32B 38/10; B32B 9/007; B32B 9/04; B32B 9/041; C01B 31/00; C01B 31/0461; H01L 29/1606; H01L 21/0272; H01L 21/2007

USPC ............ 156/254, 234, 235; 428/332
See application file for complete search history.

(56) References Cited

U.S. PATENT DOCUMENTS 8,142,754 B2 3/2012 Lanzara et al.
8,227,069 B2 7/2012 Kusunoki et al.
(Continued)

FOREIGN PATENT DOCUMENTS

CN 102206867 A 10/2011
CN 102492922 A 6/2012
(Continued)

OTHER PUBLICATIONS

Dimitrakopoulos, C., et al. "Formation of Large Scale Single Crystalline Graphene," Office Action mailed for U.S. Appl. No. 13/966,690 mailed on Jun. 19, 2014 (5 Pages).
(Continued)

*Primary Examiner* — Sonya Mazumdar
(74) *Attorney, Agent, or Firm* — David Cain; Hoffman Warnick LLC

(57) ABSTRACT

A method for transfer of a two-dimensional material includes forming a spreading layer of a two-dimensional material on a first substrate. The spreading layer has at least one monolayer. A stressor layer is formed on the spreading layer. The stressor layer is configured to apply stress to a closest monolayer of the spreading layer. The closest monolayer is exfoliated by mechanically splitting the spreading layer wherein at least the closest monolayer remains on the stressor layer. The at least one monolayer is stamped against a second substrate to adhere remnants of the two-dimensional material on the at least one monolayer to the second substrate to provide a single monolayer on the stressor layer. The single monolayer is transferred to a third substrate.

17 Claims, 8 Drawing Sheets

(51) Int. Cl.
*H01L 21/20* (2006.01)
*B32B 37/14* (2006.01)
*C01B 31/00* (2006.01)
*B32B 38/10* (2006.01)
*B32B 9/04* (2006.01)
*H01L 29/16* (2006.01)
*B32B 37/26* (2006.01)
*C01B 31/04* (2006.01)
*B32B 9/00* (2006.01)
*H01L 23/532* (2006.01)

(52) U.S. Cl.
CPC ........ *C01B31/0461* (2013.01); *H01L 21/0272* (2013.01); *H01L 21/2007* (2013.01); *H01L 23/53276* (2013.01); *B32B 2307/202* (2013.01); *B32B 2307/704* (2013.01); *Y10T 156/11* (2015.01); *Y10T 156/1153* (2015.01); *Y10T 428/24612* (2015.01); *Y10T 428/26* (2015.01)

(56) References Cited

U.S. PATENT DOCUMENTS

| | | | |
|---|---|---|---|
| 8,409,366 | B2 | 4/2013 | Ogihara et al. |
| 8,419,880 | B2 | 4/2013 | Cho et al. |
| 2006/0094243 | A1 | 5/2006 | Hong et al. |
| 2009/0155561 | A1 | 6/2009 | Choi et al. |
| 2010/0021708 | A1 | 1/2010 | Kong et al. |
| 2010/0055464 | A1 | 3/2010 | Sung |
| 2010/0143726 | A1 | 6/2010 | Golzhauser et al. |
| 2010/0323164 | A1 | 12/2010 | Ogihara et al. |
| 2011/0048625 | A1 | 3/2011 | Caldwell et al. |
| 2011/0108521 | A1 | 5/2011 | Woo et al. |
| 2011/0223094 | A1 | 9/2011 | Lanzara et al. |
| 2012/0112164 | A1 | 5/2012 | Chu et al. |
| 2012/0248401 | A1 | 10/2012 | Shin et al. |
| 2012/0308468 | A1 | 12/2012 | Choi et al. |
| 2013/0065022 | A1 | 3/2013 | Seo et al. |
| 2014/0014030 | A1 | 1/2014 | Tour et al. |

FOREIGN PATENT DOCUMENTS

| | | |
|---|---|---|
| CN | 102586868 A | 7/2012 |
| CN | 102592973 A | 7/2012 |
| CN | 102795619 A | 11/2012 |
| CN | 102206867 B | 12/2012 |
| JP | 2009200177 A | 9/2009 |
| JP | 2011006265 A | 1/2011 |
| JP | 2011009268 A | 1/2011 |
| JP | 2012-156202 | 8/2012 |
| KR | 20110042023 A | 4/2011 |
| WO | WO2012067438 A2 | 5/2012 |
| WO | WO2012141699 A1 | 10/2012 |

OTHER PUBLICATIONS

Final Office Action for U.S. Appl. No. 13/855,313 mailed Dec. 29, 2014.

Ley, L. "Synthesis and Characteristics of Large Area Graphene on SiC" 2010 8th International Conference on Vacuum Electron Sources Conference and Nanocarbon (IVESC). Oct. 2010. (1 Page) (Abstract only).

Starke, U., et al. "Large Area Quasi-Free Standing Monolayer Graphene on 3C—SiC(111)" Applied Physics Letters, vol. 99, Issue 8. Aug. 2011. (1 Page) (Abstract only).

Vo-Van, C., et al. "Epitaxial Graphene Prepared by Chemical Vapor Deposition on Single Crystal Thin Iridium Films on Sapphire" Applied Physics Letters, vol. 98, Issue 18. Mar. 2011. (4 Pages).

Wu, Y., et al. "Large Single Crystals of Graphene on Melted Copper Using Chemical Vapor Deposition" ACS Nano, vol. 6, No. 6. May 2012. pp. 5010-5017.

Bedell, S., et al. "Wafer Scale Epitaxial Graphene Transfer" U.S. Appl. No. 13/855,313, filed Apr. 2, 2013. (29 Pages).

US 9,337,274 B2

FORMATION OF LARGE SCALE SINGLE CRYSTALLINE GRAPHENE

RELATED APPLICATION DATA

This application is related to commonly assigned application Ser. No. 13/855,313, entitled "WAFER SCALE EPITAXIAL GRAPHENE TRANSFER", filed Apr. 2, 2013, and incorporated herein by reference.

BACKGROUND

1. Technical Field

The present invention relates to electronic, optical and optoelectronic devices and their fabrication, and more particularly to methods and devices for separating and isolating a graphene monolayer.

2. Description of the Related Art

Microelectronics applications have been increasingly employing graphene devices due to their conductive, mechanical and other properties. Processing of graphene is often unconventional relative to traditional processing techniques and is often difficult to control and incorporate into semiconductor processing. Graphene may be obtained using many techniques. One popular technique includes micromechanical exfoliation of graphite. This includes employing adhesive tape to repeatedly split graphite crystals into increasingly thinner pieces. The tape with attached optically transparent flakes is dissolved in acetone, and the flakes including monolayers are sedimented on an oxidized silicon wafer. This has been improved by dry deposition, avoiding the stage when graphene floated in a liquid. This is often referred to as a "scotch tape" or drawing method. This technique may not produce a uniform graphene film.

Another method of obtaining graphene is to heat silicon carbide (SiC) to high temperatures (>1,100° C.) under low or high vacuum to reduce it to graphene. This process produces epitaxial graphene with dimensions dependent upon the size of the SiC substrate (wafer). The face of the SiC used for graphene formation, silicon- or carbon-terminated, highly influences the thickness, crystal orientation, mobility and carrier density of the graphene. Exfoliation and transfer of the graphene layer is often very difficult.

Other methods use the catalytic action, carbon solubility, and atomic structure of a metal substrate to seed the growth of graphene (epitaxial growth). In one technique, copper foil is employed as the metal catalyst, and, at very low pressure under a carbon-containing gas, the growth of graphene automatically stops after a single graphene layer forms. Arbitrarily large graphene films can be created by chemical vapor deposition (CVD) growth. Multilayer graphene may also form on copper, in some areas of the substrate. However, exfoliation and transfer of the graphene layer is quite difficult. Another disadvantage of CVD growth on metal substrates is that the grown graphene layer is a poly-crystal, with randomly oriented domains.

In many of these techniques and especially with the graphitization of SiC, a top surface of the graphene may contain a double layer. This is due to the existence of vicinal terraces or other defects on the surface of the SiC substrate, areas where the growth rate is enhanced. The double layer graphene that forms along the edge of a terrace negatively impacts performance, by e.g., decreasing carrier mobility.

SUMMARY

A method for transfer of a two-dimensional material includes forming a spreading layer of a two-dimensional material on a first substrate. The spreading layer has at least one monolayer. A stressor layer is formed on the spreading layer. The stressor layer is configured to apply stress to a closest monolayer of the spreading layer. The closest monolayer is exfoliated by mechanically splitting the spreading layer wherein at least the closest monolayer remains on the stressor layer. The at least one monolayer is stamped against a second substrate to adhere remnants of the two-dimensional material on the at least one monolayer to the second substrate to provide a single monolayer on the stressor layer. The single monolayer is transferred to a third substrate.

Another method for transfer of graphene includes forming a spreading layer of graphene on a silicon carbide (SiC) substrate, the spreading layer having at least one monolayer of graphene; depositing a stressor layer on the spreading layer, the stressor layer being configured to apply stress to at least a closest monolayer of the spreading layer; bonding a handle substrate to the stressor layer; splitting the spreading layer by exfoliating the closest monolayer from the spreading layer wherein the closest monolayer remains on the stressor layer; depositing a metal over the remnants and the closest monolayer; applying a tape to the metal; stripping the metal and the tape to remove the remnants from the closest monolayer to provide a single monolayer; and transferring the single monolayer to a third substrate.

A solid-state device structure includes a substrate; and a single crystalline monolayer of graphene disposed on the substrate by a single transfer process and having a surface area of greater than 15 square inches.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
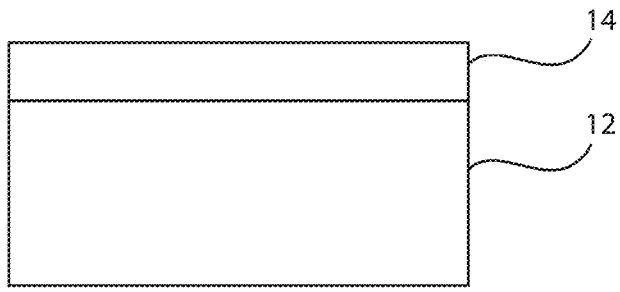
FIG. 1 is a cross-sectional view of a substrate having a spreading layer formed thereon in accordance with the present principles.

In accordance with the present principles, methods for transferring large sections of two-dimensional (2D) materials are provided. In one embodiment, a 2D material is provided on a substrate having a thickness of one or more monolayers. In one embodiment, the 2D material includes graphene and the substrate may include SiC. A stressor layer is formed on the 2D material and a handle substrate is bonded to the stressor layer. The stressor layer induces stress in at least the closest monolayer. Since the 2D material relies on weak Van der Waals forces to hold the monolayers together, the 2D material may be chemically bonded to the substrate. The stressor layer grips at least the closest monolayer, and lifting the handle substrate results in a high-quality mechanical exfoliation and lift-off of at least the closest monolayer. The top monolayer can be lifted off with little or no damage. The exfoliated monolayer of the 2D material may be transferred to another substrate.

In many instances, a double monolayer or simply a double layer of graphene is exfoliated. The second monolayer often causes performance issues when the graphene is employed in electronic devices. In accordance with the present principles, a stamping process is employed to remove the double layer from portions of the graphene monolayer. This leaves a higher quality monolayer and improves performance of the graphene by e.g., increasing carrier mobility. The 2D material may be transferred on a wafer scale, which is difficult or impossible with other techniques. While wafer scale transfer is enabled, smaller sections or patterns may be transferred as well. In one embodiment, to remove double layer strips without damage to the single layer blanket, a deposition of metal with low adhesion energy to the graphene surface may be performed. Such metal may include, e.g., Au or Pd. For the metal to be useful, the interfacial energy between metal/graphene>interfacial energy of graphene/graphene, and the interfacial energy of metal/graphene<interfacial energy graphene/substrate.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a structure 10 is illustratively shown for carrying out a lift-off process for formation of an electronic device in accordance with an exemplary embodiment. The structure 10 includes a single crystal substrate 12. In one embodiment, the single crystal substrate 12 includes Si, Ge, SiC or alloys thereof. A two-dimensional material forms a spreading or separation layer 14, which is formed on the substrate 12.

The two-dimensional (2D) material of layer 14 includes strong bonds in two dimensions and weak bonds in a third dimension. A 2D material may include weak Van der Waals forces perpendicular to a layer (weak vertical bonding) such that the material separates easily along atomic layers or strata (e.g., strength in 2D directions). Such 2D materials can be employed as interlayers to facilitate layer transfer of subsequently grown semiconductor films.

While any substrate can be employed as the base substrate 12, the base substrate 12 should be capable of offering seed locations for single crystalline deposition or formation (e.g., single crystalline graphene deposition). The 2D material of layer 14 may be deposited (epitaxially grown) on the substrate 12. The spreading layer 14 may include graphene, or other 2D materials, such as, e.g., $MoS_2$ or $WS_2$, boron nitride, mica, dichalcogenides and complex oxides.

Figure 2A:
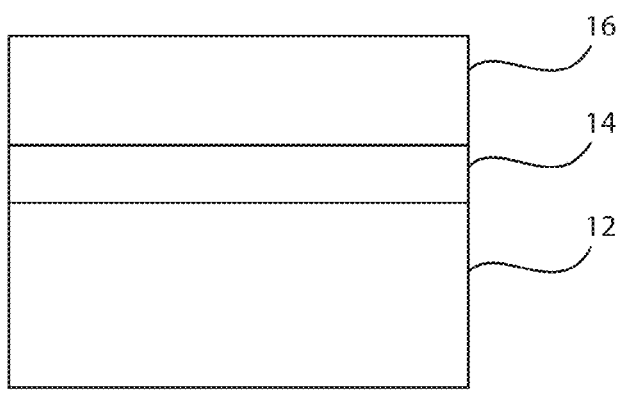
FIG. 2A is a cross-sectional view showing a stressor layer formed on the spreading layer in accordance with the present principles.

Referring to FIG. 2A, a stressor layer 16 is grown on the spreading layer 14 (e.g., graphene). The layer 16 may include a metal, an oxide, semiconductor, etc. The stressor layer 16 is configured to bond with at least a closest layer or monolayer of the 2D material of the spreading layer 14 and apply stress to the closest layer of the 2D material of the spreading layer 14. The bond strength (interface energy) is preferably greater between the stressor layer 16 and the monolayer 14 than the Van der Waals forces between the spreading layer 14 and the substrate 12. The spreading layer 14 may include covalent bonds with the substrate 12. It should be understood that other bonds (e.g., ionic bonds) may be formed between the substrate 12 and the spreading layer 14 depending on the material selection.

The stressor layer 16 is preferably not lattice-matched to the underlying substrate 12, although it may be. Stress may be applied based upon differences in thermal conductivities, expansion/contraction, increasing density or thickness or by other methods. A lattice-mismatch or other stress inducing mechanism is helpful in applying a stress to layer 14, which assists during exfoliation. In particularly useful embodiments, the stressor layer 16 is applied by a deposition process, such as chemical vapor deposition (CVD), physical vapor deposition (PVD) (e.g., sputtering, evaporation), etc. The stressor layer 16 may include SiGe, Aluminum oxide, Ni, etc.

Figure 2B:
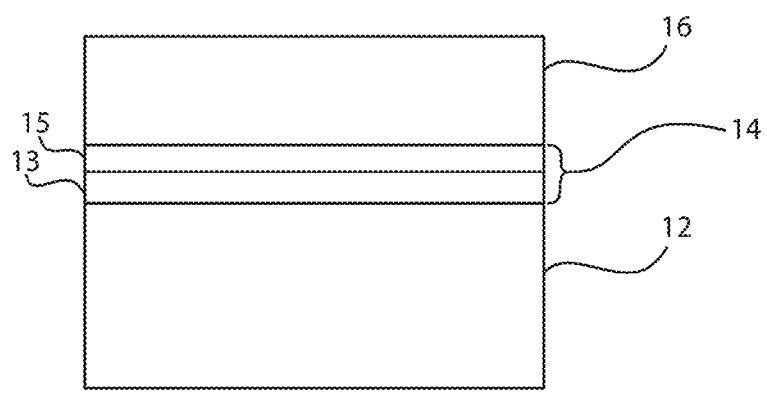
FIG. 2B is a cross-sectional view showing a stressor layer formed on a graphene spreading layer on a SiC substrate in accordance with the present principles.

Referring to FIG. 2B, in one particularly useful embodiment, the spreading layer 14 includes graphene 15 and most likely a buffer layer 13 on a SiC substrate 12. The graphene 15 is employed for and may be formed by a thermal decomposition of a face of a SiC wafer (substrate 12). Si removal from the SiC surface results in the formation of graphene at the surface of SiC. In a SiC substrate 12, below the layer of epitaxial graphene 15 on a SiC face (0001), there is always a carbon rich layer or the buffer layer 13 that is iso-structural to graphene 15 with respect to the 2D arrangement of the C atoms. The buffer layer 13 does not possess the $sp^2$ structure of graphene 15, and thus is not graphene. The buffer layer 13 is also called the 6rt3x6rt3.R30 reconstruction of the SiC surface. It is estimated that about 30-40% of the C atoms in the buffer layer 13 are covalently bonded to underlying Si atoms in the SiC substrate 12. The buffer layer 13 is insulating and does not possess any of the unique properties of graphene. In accordance with the present principles, the covalent bonds can be exploited to enable monolayer (or multiple monolayer) exfoliation of the graphene 15.

In one embodiment, an epitaxial carbon monolayer deposition may be employed to form graphene 15 on the surface of the SiC substrate 12. In still other embodiments, graphene or other 2D materials may be deposited on the substrate 12 by other methods.

In another embodiment, graphene 15 is formed by heating SiC substrates to temperatures greater than 1000 degrees C. resulting in Si evaporation out from the substrate leaving one or more monolayers of single crystalline carbon (graphene). Epitaxial graphene can be grown on semi-insulating 4H- or 6H-(0001) SiC wafer surfaces within an induction-heated graphite susceptor located in an evacuatable chamber (e.g., a stainless steel vacuum chamber or quartz tube furnace) using a multistep process comprising surface preparation steps. For example, these steps may include annealing at 810° C. for 10 min and 1140° C. for 7 min under flow of 20% disilane in He, or annealing at a temperature around 1600° C. in $H_2$ gas. Then, a graphitization step is employed at 1450-1620 degrees C. under Ar flow at a chamber pressure from 3.5 mTorr to 900 mTorr for durations of 5 min to 2 hours. Other process parameters are also contemplated.

Graphene 15 is atomically smooth, and when applied to the substrate 12, a small thickness is desired. In one embodiment, the thickness of the graphene spreading layer 14 is preferably one or more monolayers. In useful embodiments, the number of monolayers of graphene may be determined depending on what is needed to cleanly separate the graphene to produce a split as will be described. The present embodiments will be described in terms of a graphene monolayer structure on a SiC buffer layer 13; however, other 2D materials may be employed for the spreading layer 14 on other substrate materials.

The stressor layer 16 is grown on the graphene 15. The layer 16 may include a metal, an oxide, semiconductor, etc. The stressor layer 16 is configured to bond with the closest layer of graphene 15 and apply stress thereto. The bond strength is preferably greater between the stressor layer 16 and the graphene 15 than the Van der Waals forces between the graphene 15 and the buffer layer 13. The buffer layer 13 includes covalent bonds with the substrate 12.

The stressor layer 16 is preferably not lattice-matched to the underlying substrate 12, although it may be. Stress may be applied based upon differences in thermal conductivities, expansion/contraction, increasing density or thickness or by other methods. A lattice-mismatch or other stress inducing mechanism is helpful in applying a stress to monolayers of graphene 15, which assists during exfoliation. In particularly useful embodiments, the stressor layer 16 is applied by a deposition process, such as chemical vapor deposition (CVD), physical vapor deposition (PVD) (e.g., sputtering, evaporation), etc. The stressor layer 16 may include SiGe, Aluminum oxide, Ni, etc.

In the present example, bonding energy of graphene on SiC can be determined to be about 0.7 J/m$^2$. Typical bonding energy of graphene in graphite is about 0.3 J/m$^2$. Therefore, graphene 15 on SiC 12 is more difficult to exfoliate. For the stressor layer 16, the layer 16 should provide energy close to 0.7 J/m$^2$, and the layer 16 should be deposited with a particular thickness and stress. The greater the thickness, the more stress/strain is applied (energy) to exfoliate. The stress should start to open up cracks at the edge of interface with the graphene 15. For example, a 350 nm thick 1 GPa tensile metal film can provide ~0.7 J/m$^2$, e.g., using evaporated Ni. Therefore, a Ni film for layer 16 should be thinner than about 350 nm so that it provides strain energy just below 0.7 J/m$^2$. In this way, exfoliation can be prevented during deposition. The energy provided to exfoliate is increased with the addition of a handle substrate or tape as will be described to provide a little extra energy to exfoliate.

In one example, a sputtered Ni at 10 Torr shows stress levels of 600 MPa. One micron of sputtered Ni can provide 0.7 J/m$^2$ energy. Only 0.8 microns may be needed if additional layers, the handle substrate or tape are employed. The stress should be controlled as stress in the stressor layer 16 can crack the layer being exfoliated during the exfoliation process. Upon exfoliation, the tensile films of layer 16 shrink During this process, the exfoliated film can be cracked because the film is stuck to the tape or handle substrate, which prevents the shrinking Allowable stress ranges between about 500M Pa-800 MPa. Thicker films are better to avoid cracking since they are mechanically more robust. One micron or greater thickness is preferred.

Figure 3A:
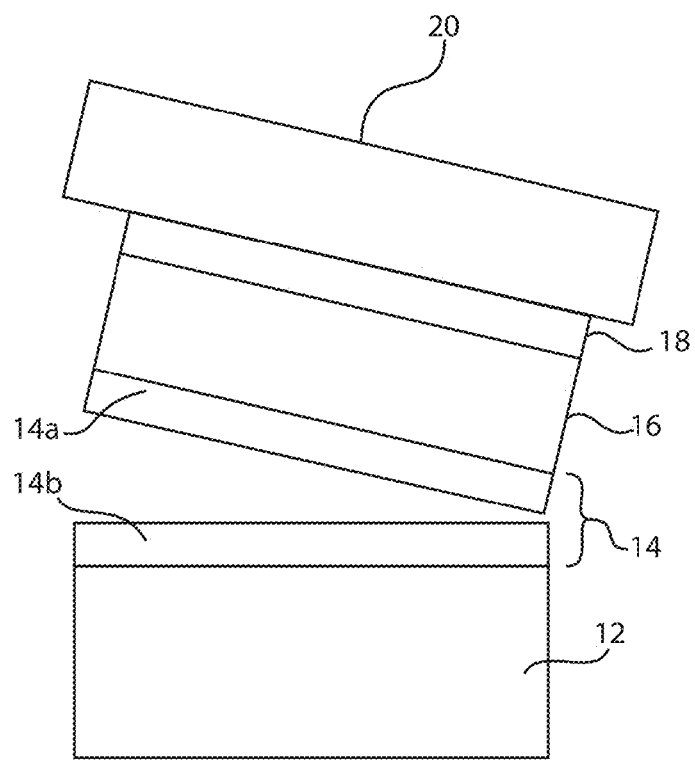
FIG. 3A is a cross-sectional view showing a handle substrate adhered to the stressor layer for handling a split off of one or more monolayers of the spreading layer in accordance with the present principles.

Referring to FIG. 3A, a handle substrate (or tape) 20 may be adhered to layer 16. Handle substrate 20 may include any suitable material and may include a crystalline substrate, a ceramic or a flexible material. The handle or flexible substrate 20 may include a polymeric material(s), such as, e.g., thermoplastics, e.g., polyethylene terephthalate (PET), polyimide, etc.; reinforced epoxy resins, such as e.g., prepreg boards, etc. The flexible substrate 20 may be glued or otherwise adhered by an adhesive or adhering layer 18 to the stressor layer 16. In other embodiments, additional layers may be employed between the flexible substrate 20 and the layer 16.

Next, a cleaving process is employed to split or spread the spreading layer 14 to divide the monolayer or monolayers. Depending on the energies and the bonding, the spreading layer 14 may be split to provide one or more monolayers 14$a$ of the spreading layer 14 on the stressor layer 16 and zero or more monolayers 14$b$ of the spreading layer 14 on the substrate 12. If the spreading layer 14 is covalently bonded to the single crystal substrate 12, a portion 14$b$ remains in place on the substrate 12 during the splitting process, although is some embodiments no portion of the spreading layer remains on the substrate 12. The single crystal substrate 12 is reusable for other steps or for growing additional layers for other devices.

The cleaving process includes a layer splitting by mechanical force (e.g., spalling, smart-cut, etc.). In this way, layer 16 can be lifted off from substrate 12 having monolayer(s) 14$a$ attached thereto. The monolayer 14$a$ may be wafer-sized, meaning the exfoliation can be performed over the entire wafer in a single process. By applying stress, spreading layer 14 is split leaving one or more monolayers 14$a$ of material (graphene) in contact with the layer 16.

Figure 3B:
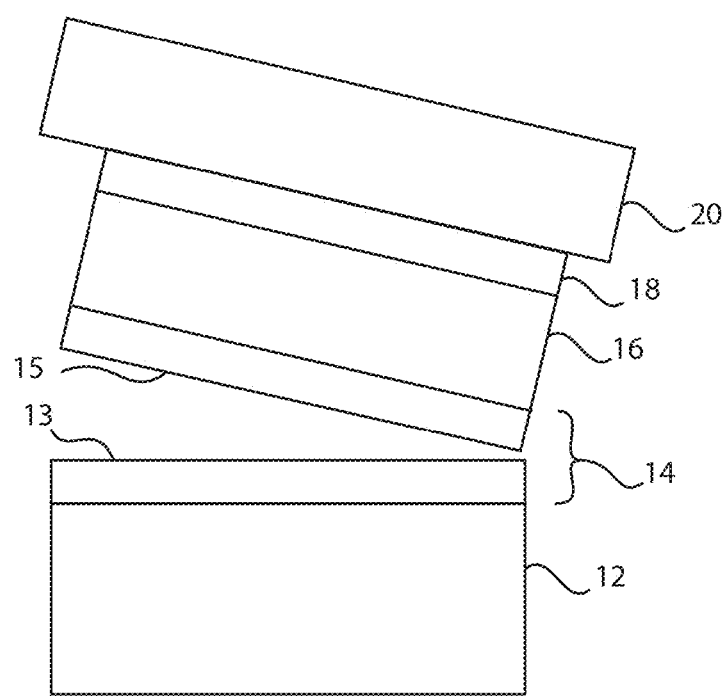
FIG. 3B is a cross-sectional view showing a handle substrate adhered to the stressor layer for handling one or more split off monolayers of graphene from a buffer layer in accordance with the present principles.

Referring to FIG. 3B, the handle substrate 20 may be adhered to layer 16, as before. The cleaving process is employed to split or spread the spreading layer 14 to divide the monolayer or monolayers. Since buffer layer 13 is bonded to the single crystal substrate 12, this portion may remain in place on the substrate 12 during the splitting process. However, all, some or none of the buffer layer 13 may be removed with the graphene 15. The single crystal substrate 12 is reusable for other steps or for growing additional layers for other devices.

The cleaving process includes a layer splitting by mechanical force (e.g., spalling, smart-cut, etc.). In this way, layer 16 can be lifted off from substrate 12 having monolayer(s) of graphene 15 attached thereto. The monolayer 15 may be wafer-sized, meaning the exfoliation can be performed over the entire wafer in a single process. By applying stress, spreading layer 14 is split leaving one or more monolayers of material (graphene 15) in contact with the layer 16.

Figure 4:
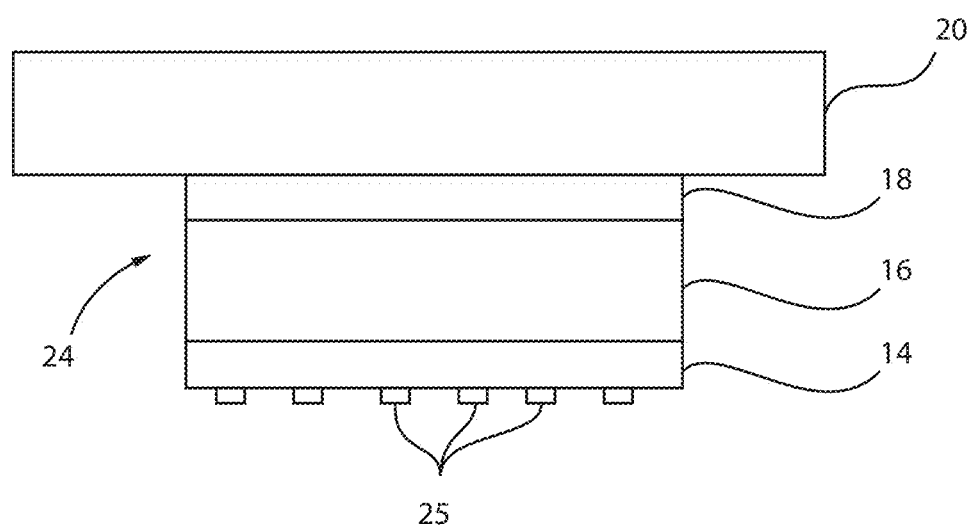
FIG. 4 is a cross-sectional view showing a handle substrate coupled to the stressor layer, the stressor layer carrying a monolayer and remnants of the 2D material in accordance with the present principles.

Referring to FIG. 4, a device stack 24 may be employed to fabricate devices or may be employed to transfer the monolayer or monolayers (14$a$, 15) of the spreading layer 14 (hereinafter called monolayer 14 for ease of reference) to another wafer or substrate 22. Monolayer 14 may include remnants 25 which include additional monolayers. These additional monolayers or remnants 25 are often unwanted and need to be removed.

Figure 5:
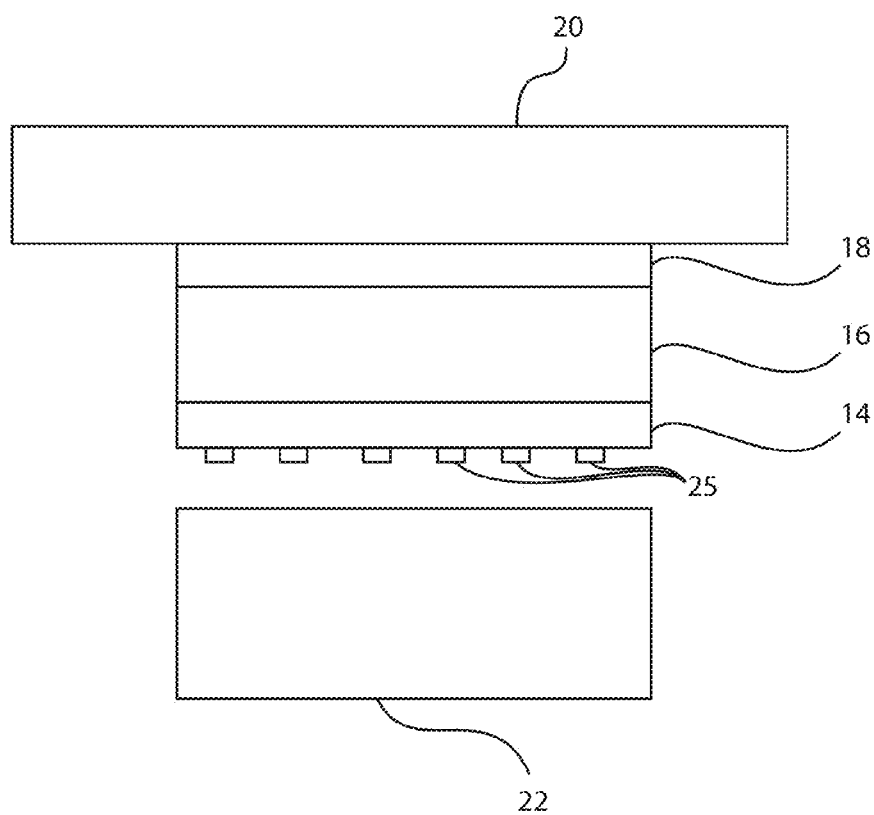
FIG. 5 is a cross-sectional view showing the monolayer and remnants of the 2D material held over a substrate for removing the remnants in accordance with the present principles.

Referring to FIG. 5, to remove the remnants 25 from the monolayer 14, a stamping process is performed. A substrate 22 is provided against which the remnants 25 are brought into contact. It should be understood that the substrate 22 is depicted as a single layer, but may include multiple layers. At least a surface of the substrate 22 may include a silicon oxide (e.g., SiO$_2$), polymeric organosilicon compounds, such as polydimethylsiloxane (PDMS), hexamethyldisilazane (HDMS), hexamethyldisiloxane (also HDMS) or any other material capable of holding graphene.

Figure 6:
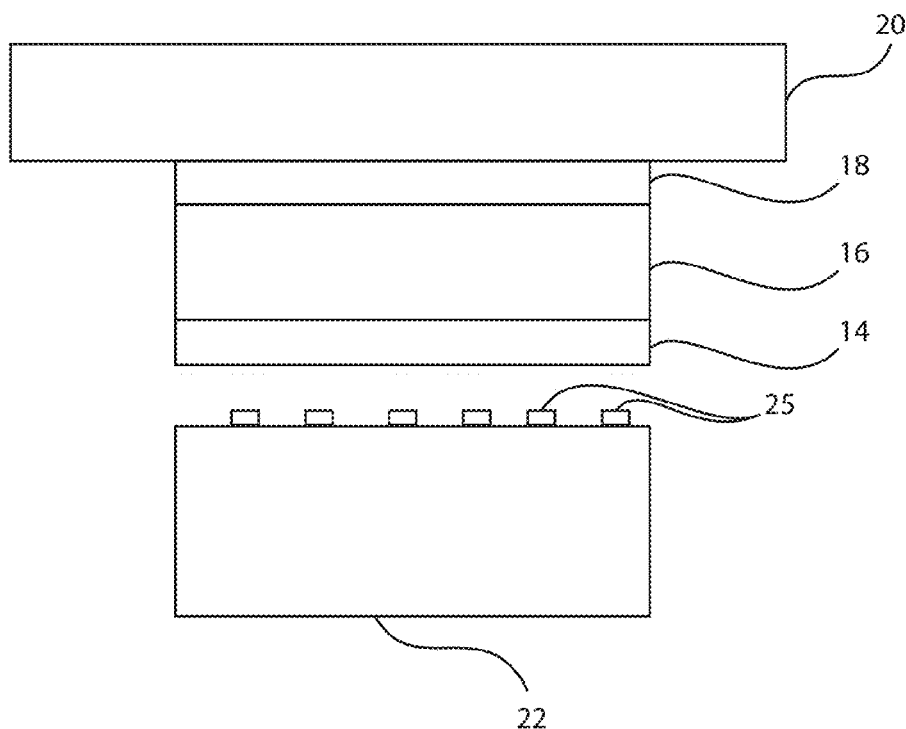
FIG. 6 is a cross-sectional view showing the monolayer with the remnants of the 2D material transferred to the second substrate in accordance with the present principles.

The remnants 25 are brought in contact with the surface of the substrate 22 and a contact pressure is developed as part of the stamping process. As a result of the stamping process, the remnants are transferred to the substrate 22 as depicted in FIG. 6. Note that the stamping process may be performed a plurality of times to remove excess monolayers (remnants 25) from the base monolayer 14.

Figure 7:
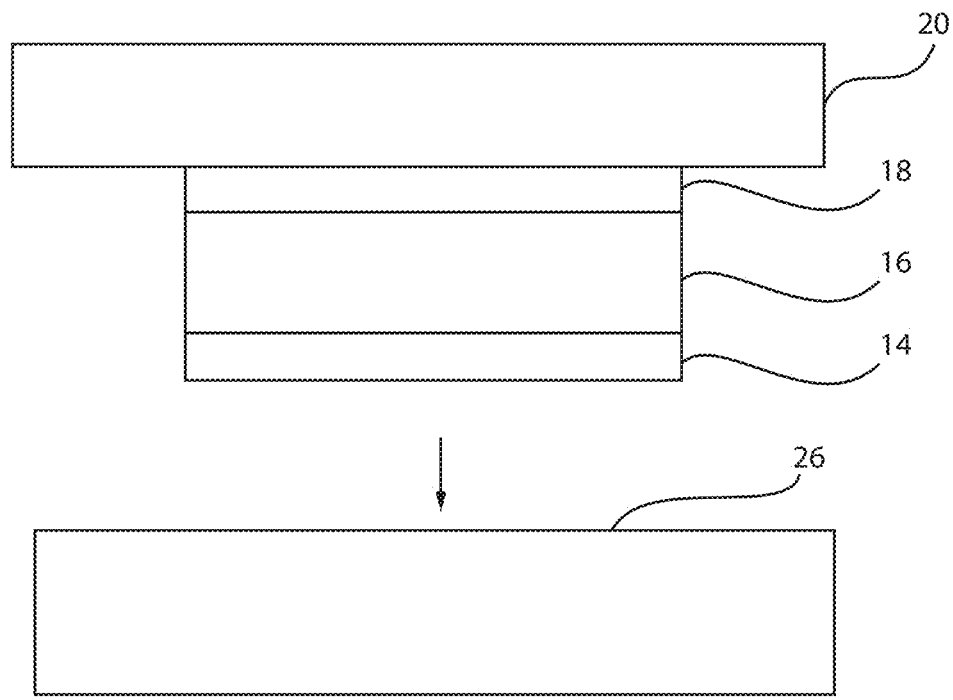
FIG. 7 is a cross-sectional view of the handle substrate stack transferring the monolayer to a third substrate in accordance with the present principles.

Referring to FIG. 7, the monolayer 14 is shown over a substrate 26 onto which the monolayer 14 will be transferred. The substrate 26 may include Si, GaAs, SiC, GaN, InP or any other suitable substrate material. The monolayer 14 is brought in contact with the substrate 26 and the stressor layer 16. The monolayer 14 may be pressed against a surface of the substrate 26. Then, an etching process may be employed to remove the stressor layer 16 to affect the transfer of the monolayer 14.

It should be noted that if the stress of the stressor layer 16 is too small, monolayer 14 (e.g., graphene) will not stick to substrate 26. Therefore a sufficient amount of stress is needed to aid in releasing the monolayer 14. Therefore, stress in the stressor layer 16 should be maintained to a value of greater than about 500 MPa. The monolayer 14 can extend over the entire chip or wafer (26). The stressor layer 16 is removed, e.g., by selective etching or other process.

Figure 8:
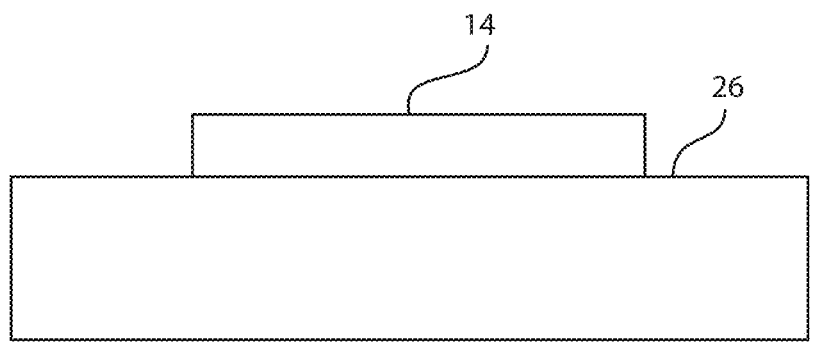
FIG. 8 is a cross-sectional view showing a monolayer transferred to the third substrate in accordance with the present principles.

Referring to FIG. 8, the monolayer 14 is shown transferred onto the substrate 26. The substrate 26 and the monolayer 14 may be employed to fabricate a solid-state device or devices. The substrate 26 may include a semiconductor substrate, such as Si, SiC, or other material. The monolayer 14 is preferably a single crystalline monolayer of graphene disposed on the substrate 26 by a single transfer process, as described above.

In accordance with the present principles, a single large sheet of graphene can be transferred, e.g., a surface area of greater than about 15 square inches can be transferred to the substrate 26, although smaller surface areas are also contemplated.

Processing may continue and employ the nature of the monolayer 14 formed in accordance with the present principles. The monolayer 14 may be employed to form conductive channels or other structures for transistor devices, capacitors, electric wires, photosensitive devices, biosensors, wrap-around multi-channel transistors, etc. It should be understood that parts of the monolayer 14 may be etched away to create islands, nanostructures (e.g., ribbons, wires, dots), etc. In this way, nanostructures may be employed locally to form devices in isolation of other devices. The monolayer 14 is defect-free or has negligible defects in accordance with the present principles.

Figure 9A:
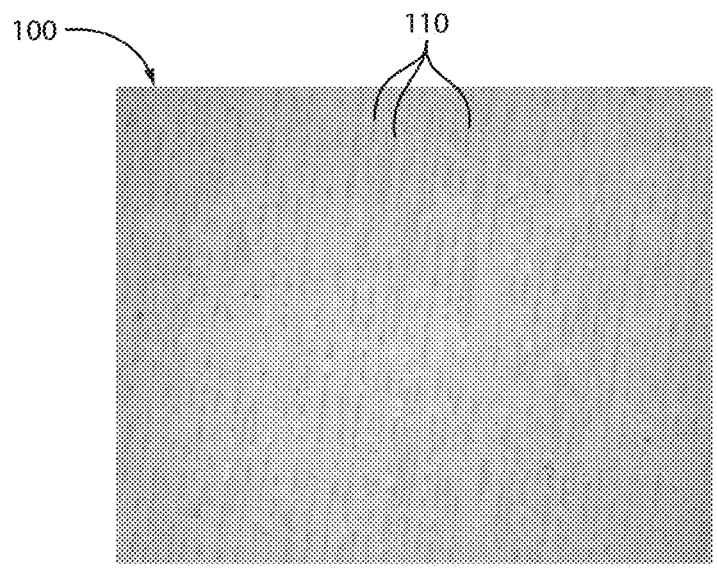
FIG. 9A is an image showing a monolayer having veins indicating remnants of 2D material remaining on the monolayer.
Figure 9B:
FIG. 9B is an image showing the monolayer after a first stamping process employed to remove the remnants of 2D material remaining on the monolayer in accordance with the present principles.
Figure 9C:
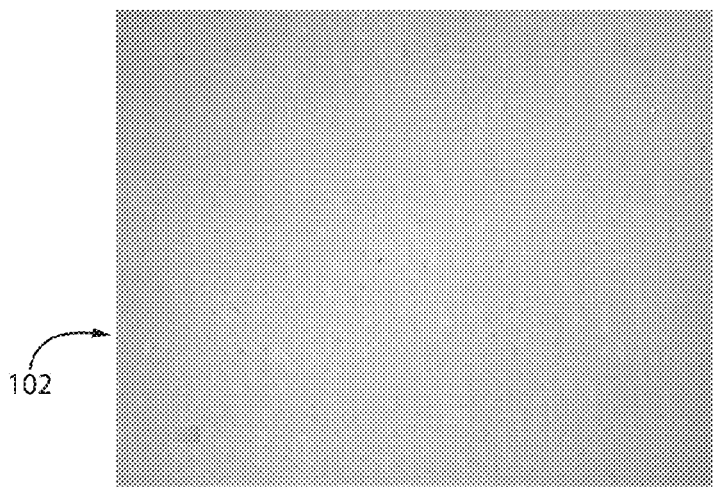
FIG. 9C is an image showing the monolayer after a second stamping process employed to remove more of the remnants of 2D material remaining on the monolayer in accordance with the present principles.

Referring to FIG. 9A, an image 100 of a surface shows ridges or veins 110 thereon, which are caused by the formation of double or greater numbers of monolayers. FIG. 9B shows an image 101 of a same surface after a first stamping in accordance with the present principles. The number and intensity of the veins 110 is significantly decreased. FIG. 9C shows an image 102 of the same surface after a second stamping in accordance with the present principles. The veins 110 are essentially gone leaving a pristine and uniform monolayer of graphene.

Figure 10:
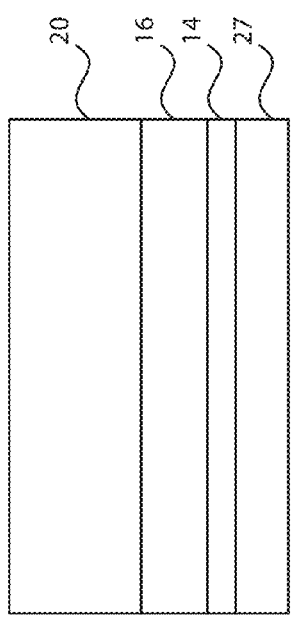
FIG. 10 is a cross-sectional view showing a metal deposited on the remnants and blanket monolayer of FIG. 4 in accordance with another embodiment.

Referring to FIG. 10, in another embodiment, to remove double layer strips 25 without damage to the monolayer 14, a deposition of a metal 27 with low adhesion energy may be applied to the surface of the monolayer 14 and over the remnants 25 as depicted in FIG. 4. The metal may include a few nanometers in thickness (e.g., 10-50 nm) although higher thicknesses may be employed. The metal may include Au or Pd, although other materials may be employed as well, such that the material selected permits removal of the double layers (remnants 25) without damaging the monolayer 14. For example, interfacial energy between the metal and graphene should be greater than the interfacial energy between graphene and graphene; and the interfacial energy between the metal and the graphene should be less than the interfacial energy between graphene and the supporting substrate (e.g., stressor layer 16). The metal deposition may be performed by any suitable deposition process, e.g., vacuum evaporation, chemical vapor deposition, etc.

Figure 11:
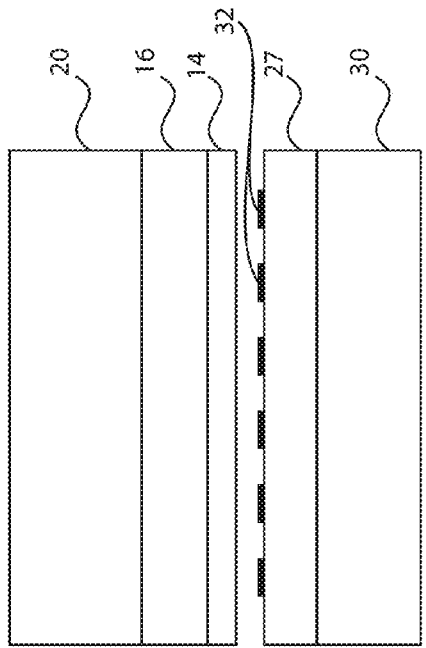
FIG. 11 is a cross-sectional view showing the metal and a tape stripped off to remove the remnants from the blanket monolayer of FIG. 10 in accordance with the present principles.

Referring to FIG. 11, after deposition of the metal layer 27, a tape 30 is placed or adhered to the metal layer 27. Due to the adhesion forces set through material selection and processing, the tape 30 along with the metal layer 27 are lifted off or exfoliated from the blanket graphene layer 14 such that double layer strips or remnants 32 are removed from the layer 14. In this way, as before, the graphene layer 14 is left without double layer strips and includes a single monolayer.

Figure 12:
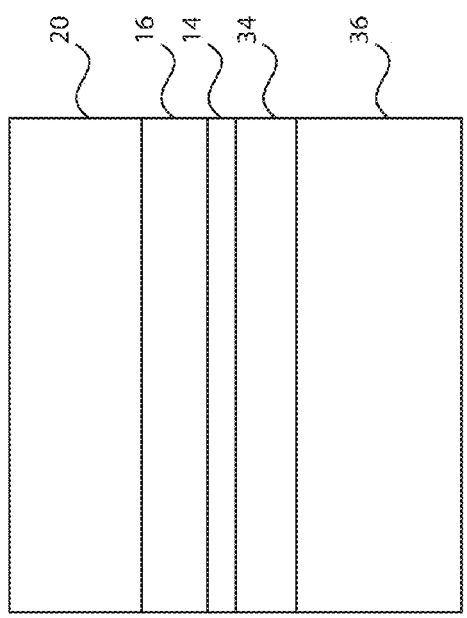
FIG. 12 is a cross-sectional view showing the blanket monolayer transferred to another substrate in accordance with the present principles.

Referring to FIG. 12, in one embodiment, the monolayer of graphene (layer 14) is transferred to a dielectric layer 34, which may include silicon dioxide (e.g., 90 nm in thickness). The dielectric layer 34 may be formed on a substrate 36, such as a monocrystalline silicon substrate. Other dielectric and substrate materials may also be employed. The transfer process may include a dry transfer.

Figure 13:
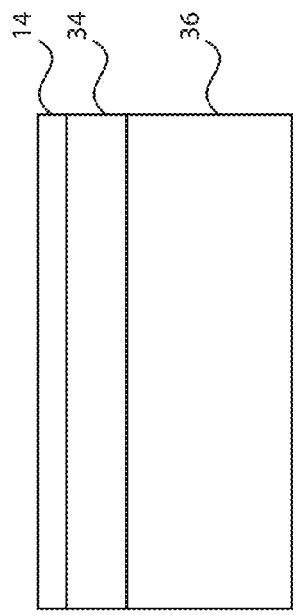
FIG. 13 is a cross-sectional view showing the blanket monolayer on the transfer substrate in accordance with the present principles.

Referring to FIG. 13, the tape 20 is then removed from the stressor layer 16 by, e.g., a thermal release process. The stressor layer 16 is then wet etched as before. In one embodiment, the stressor layer includes Ni and the wet etch may include, e.g., a $FeCl_3$ wet etch. The monolayer 14 is preferably a single crystalline monolayer of graphene disposed on the substrate 36 by a single transfer process, as described above. In accordance with the present principles, a single large sheet of graphene can be transferred, e.g., a surface area of greater than about 15 square inches can be transferred to the substrate 36, although smaller surface areas are also contemplated.

Figure 14:
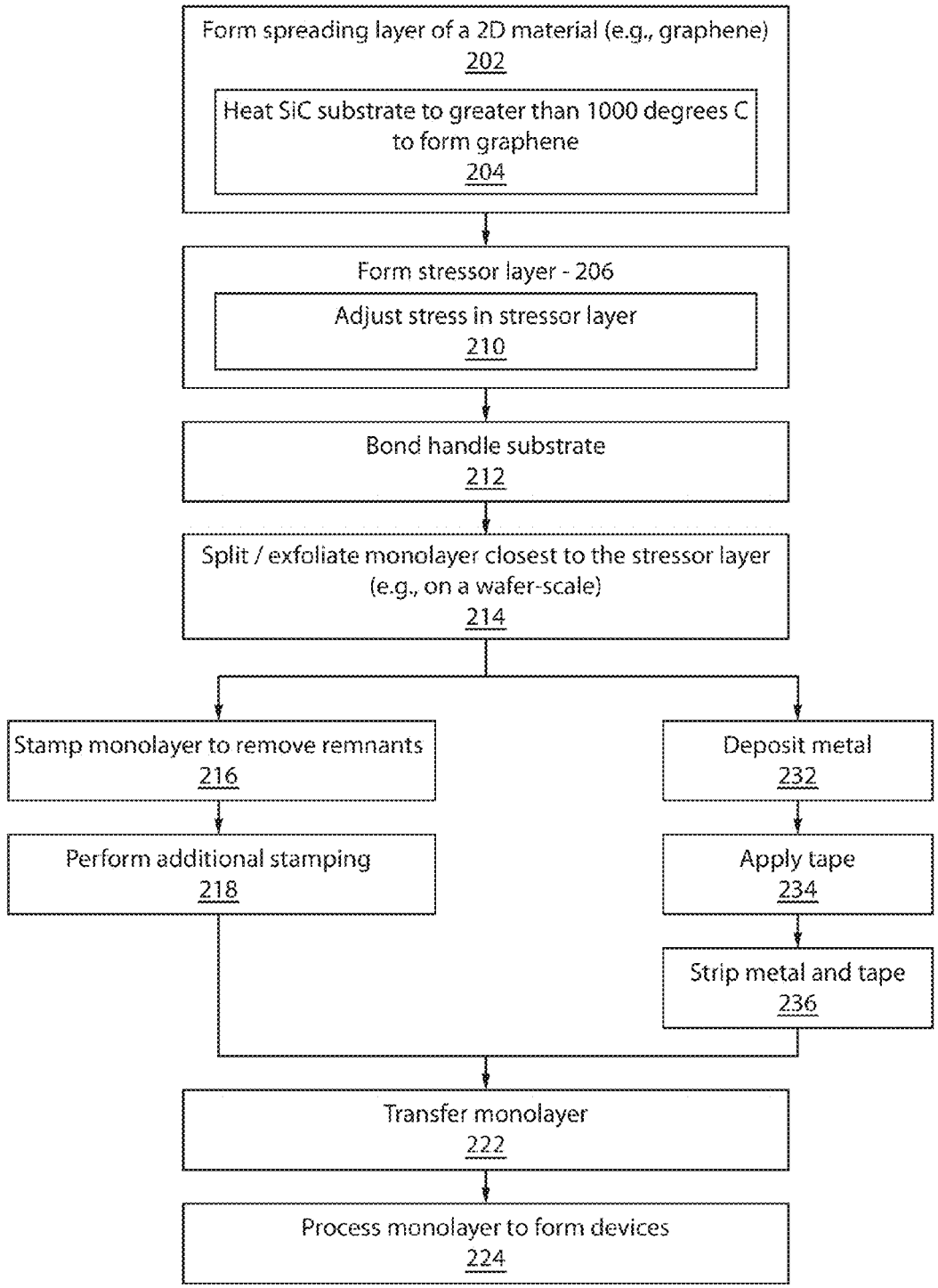
FIG. 14 is a block/flow diagram showing methods for transfer of a monolayer in accordance with illustrative embodiments.

Referring to FIG. 14, a block/flow diagram shows a method for transferring a single crystalline monolayer to a substrate in accordance with illustrative embodiments. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 202, a spreading layer of a two-dimensional (2D) material is formed on a first substrate. The spreading layer includes at least one monolayer. In one embodiment, the first substrate includes SiC, and the spreading layer includes graphene, wherein forming the spreading layer includes heating the SiC substrate to a temperature greater than 1000 degrees C. in block 204.

In block 206, a stressor layer is formed on the spreading layer. The stressor layer is configured to apply stress to a closest monolayer of the spreading layer. One of a metal, an oxide and a semiconductor is formed as the stressor layer to induce stress in the closest monolayer of the spreading layer. In block 210, stress in the stressor layer may be adjusted during or after its formation by heating/cooling, modifying a thickness, modifying density, etc.

In block 212, a handle substrate may be bonded to the stressor layer to affect exfoliation. In block 214, a monolayer is exfoliated by mechanically splitting the spreading layer wherein at least the closest monolayer remains on the stressor layer. The at least closest monolayer is lifted off by using induced stress of the stressor layer to overcome Van der Waals forces holding the closest monolayer to adjacent material. The closest monolayer is preferably exfoliated on a wafer scale, although smaller sections may be employed.

In block 216, in one embodiment stamping is employed to remove double layers. The closest monolayer is stamped against a second substrate to adhere remnants of the two-dimensional material on the closest monolayer to the second substrate to provide a single monolayer on the stressor layer. The second substrate is sticky to permit the double layers to stick thereto. In block 218, additional stamping steps may be performed to further remove the remnants.

In block 232, an alternate embodiment includes a low adhesion metal, e.g., Au, Pd, although other metals may be employed, that may be deposited (e.g., by vacuum evaporation) over a monolayer having double strips of, e.g., graphene, on the stressor layer after the splitting step in block 214. For the metal to be useful, the interfacial energy between metal/monolayer material>interfacial energy of monolayer material/monolayer material, and the interfacial energy of metal/monolayer material<interfacial energy monolayer material/substrate. In block 234, a tape is added to the adhesion metal. In block 236, the tape and the adhesion metal are stripped off removing any remnants or double layers from the monolayer.

In block 222, the single monolayer is transferred to a third substrate. In block 224, the monolayer may be patterned or otherwise fashioned into electronic devices, wires, etc.

Having described preferred embodiments formation of large scale single crystalline graphene (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for transfer of a two-dimensional material, comprising:
    forming a spreading layer of a two-dimensional material on a first substrate, the spreading layer having at least one monolayer;
    forming a stressor layer on the spreading layer, the stressor layer being configured to apply stress to a closest monolayer to the stressor layer of the spreading layer;
    exfoliating the closest monolayer by mechanically splitting the spreading layer, leaving remnants of the two-dimensional material from the at least one monolayer, on the closest monolayer, wherein the closest monolayer remains on the stressor layer;
    stamping the closest monolayer against a second substrate to adhere the remnants of the two-dimensional material on the closest monolayer to the second substrate to provide a single monolayer on the stressor layer; and
    transferring the single monolayer to a third substrate.

2. The method as recited in claim 1, wherein the first substrate includes SiC and the spreading layer includes graphene, and wherein forming the spreading layer includes heating the SiC substrate to a temperature greater than 1000 degrees C.

3. The method as recited in claim 1, wherein forming the stressor layer includes depositing one of a metal, an oxide and a semiconductor to induce stress in the closest monolayer of the spreading layer.

4. The method as recited in claim 1, wherein exfoliating the closest monolayer includes lifting off the at least closest monolayer by using induced stress of the stressor layer to overcome Vander Waals forces holding the closest monolayers to adjacent material.

5. The method as recited in claim 1, further comprising:
    bonding a handle substrate to the stressor layer to affect the step of exfoliating.

6. The method as recited in claim 1, wherein the closest monolayer is exfoliated on a wafer scale.

7. The method as recited in claim 1, further comprising adjusting stress in the stressor layer during or after its formation.

8. The method as recited in claim 1, further comprising performing additional stamping steps to further remove the remnants.

9. The method as recited in claim 1, further comprising depositing a metal over the remnants and the closest monolayer.

10. A method for transfer of graphene, comprising:
    forming a spreading layer of graphene on a silicon carbide (SiC) substrate, the spreading layer having at least one monolayer of graphene;
    depositing a stressor layer on the spreading layer, the stressor layer being configured to apply stress to at least a closest monolayer of the spreading layer;
    bonding a handle substrate to the stressor layer;
    splitting the spreading layer by exfoliating the closest monolayer from the spreading layer, leaving remnants of the two-dimensional material from the at least one monolayer, on the closest monolayer, wherein the closest monolayer remains on the stressor layer;
    depositing a metal over remnants and the closest monolayer;
    applying a tape to the metal;
    stripping the metal and the tape to remove the remnants from the closest monolayer to provide a single monolayer on the stressor layer; and
    transferring the single monolayer to a third substrate.

11. The method as recited in claim 10, wherein forming the spreading layer includes heating the SiC substrate to a temperature greater than 1000 degrees C.

12. The method as recited in claim 10, wherein depositing the stressor layer includes depositing one of a metal, an oxide and a semiconductor to induce stress in the closest monolayer of the spreading layer.

13. The method as recited in claim 10, wherein splitting the closest monolayer includes lifting off the at least closest monolayer by using induced stress of the stressor layer to overcome Vander Waals forces holding the closest monolayer to adjacent material.

14. The method as recited in claim 10, wherein the closest monolayer is exfoliated on a wafer scale.

15. The method as recited in claim 10, further comprising adjusting stress in the stressor layer during or after its formation.

16. The method as recited in claim 10, wherein the metal includes an interfacial energy such that the interfacial energy between metal and graphene is greater than an interfacial energy of graphene to graphene, and an interfacial energy of metal to graphene is less than an interfacial energy of graphene to the stressor layer.

17. The method as recited in claim 10, wherein transferring the single monolayer includes etching away the stressor layer to release the single monolayer onto the third substrate.

* * * * *